(12) United States Patent
Sugiyama et al.

(10) Patent No.: US 9,209,402 B2
(45) Date of Patent: Dec. 8, 2015

(54) METHOD OF MANUFACTURING EL DISPLAY DEVICE

(71) Applicant: PANASONIC CORPORATION, Osaka (JP)

(72) Inventors: Kazushi Sugiyama, Hyogo (JP); Miki Fukushima, Osaka (JP); Yuki Imai, Osaka (JP); Yasunori Negoro, Hyogo (JP)

(73) Assignee: Joled Inc., Tokyo (JP)

( * ) Notice: Subject to any disclaimer, the term of this patent is extended or adjusted under 35 U.S.C. 154(b) by 0 days.

(21) Appl. No.: 14/586,737

(22) Filed: Dec. 30, 2014

(65) Prior Publication Data

US 2015/0118767 A1 Apr. 30, 2015

Related U.S. Application Data

(63) Continuation of application No. PCT/JP2014/002160, filed on Apr. 16, 2014.

(30) Foreign Application Priority Data

Apr. 22, 2013 (JP) .................................. 2013-089025

(51) Int. Cl.
*G01R 31/26* (2014.01)
*H01L 21/66* (2006.01)
(Continued)

(52) U.S. Cl.
CPC ............ *H01L 51/0031* (2013.01); *G09G 3/006* (2013.01); *G09G 3/32* (2013.01);
(Continued)

(58) Field of Classification Search
USPC ................. 348/E17.005, 222.1, E7.085, 135; 356/213, 121, 218; 250/214; 345/690, 345/82
See application file for complete search history.

(56) References Cited

U.S. PATENT DOCUMENTS 4,882,739 A 11/1989 Potash et al.
5,959,982 A 9/1999 Federkins et al.
(Continued)

FOREIGN PATENT DOCUMENTS

JP 2001-350442 A 12/2001
JP 2006-148756 A 6/2006
(Continued)

OTHER PUBLICATIONS

United States Office Action issued in U.S. Appl. No. 12/778,617 dated Jun. 15, 2012.
(Continued)

*Primary Examiner* — Telly Green
(74) *Attorney, Agent, or Firm* — McDermott Will & Emery LLP (57) ABSTRACT

A method of manufacturing an EL display device having a light emitting part, in which a plurality of pixels are arrayed, and a thin-film transistor array device to control light emission of the light emitting part, includes a luminance measurement step of obtaining luminance data of pixel, with the light emitting part being lit. The luminance measurement step includes a first luminance measurement step and a second luminance measurement step. In the first luminance measurement step, a first imaging apparatus obtains luminance data by measuring light emission of the each pixel. The first apparatus has a resolution corresponding to that of the pixels of the light emitting part. In the second luminance measurement step after the first step, a second imaging apparatus measures light emission of a plurality of the pixels to correct the luminance data of the each pixel obtained in the first luminance measurement step. The second imaging apparatus is lower in resolution than the first imaging apparatus.

1 Claim, 6 Drawing Sheets

(51) Int. Cl.
    *H01L 51/00*     (2006.01)
    *H05B 33/10*     (2006.01)
    *G09G 3/00*     (2006.01)
    *G09G 3/32*     (2006.01)
    *H01L 27/32*     (2006.01)
    *G01J 1/42*     (2006.01)
    *G01J 3/50*     (2006.01)

(52) U.S. Cl.
    CPC ........... *H01L 27/3244* (2013.01); *H05B 33/10* (2013.01); *G01J 3/506* (2013.01); *G01J 2001/4247* (2013.01); *G09G 2320/0693* (2013.01)

(56) References Cited

U.S. PATENT DOCUMENTS

| | | |
|---|---|---|
| 6,362,762 B1 | 3/2002 | Jensen et al. |
| 6,657,712 B2 * | 12/2003 | Yamaguchi .................. 356/213 |
| 6,690,655 B1 | 2/2004 | Miner et al. |
| 6,891,841 B2 | 5/2005 | Leatherbury et al. |
| 7,227,519 B1 | 6/2007 | Kawase et al. |
| 8,194,636 B1 | 6/2012 | Doherty et al. |
| 8,797,419 B2 * | 8/2014 | Nakata .................. 348/222.1 |
| 2003/0184738 A1 * | 10/2003 | Yamaguchi .................. 356/213 |
| 2004/0005902 A1 | 1/2004 | Belcea |
| 2005/0069025 A1 | 3/2005 | Kimura |
| 2005/0143004 A1 | 6/2005 | Dibiaso et al. |
| 2006/0110032 A1 | 5/2006 | Toshihiro et al. |
| 2006/0187866 A1 | 8/2006 | Werb et al. |
| 2008/0019309 A1 | 1/2008 | Kwun et al. |
| 2008/0186893 A1 | 8/2008 | Kolding et al. |
| 2008/0253492 A1 | 10/2008 | Wang et al. |
| 2010/0008272 A1 | 1/2010 | Messinger et al. |
| 2011/0143781 A1 | 6/2011 | Gehlen et al. |
| 2012/0027146 A1 | 2/2012 | Hodge et al. |
| 2012/0105627 A1 * | 5/2012 | Nakata .......................... 348/135 |
| 2014/0240375 A1 * | 8/2014 | Ha ................................ 345/690 |

FOREIGN PATENT DOCUMENTS

| | | |
|---|---|---|
| JP | 201-249089 A | 12/2011 |
| JP | 2013-250420 A | 12/2013 |

OTHER PUBLICATIONS

United States Office Action issued in U.S. Appl. No. 12/778,617 dated Jan. 16, 2013.

Final Office Action issued in U.S. Appl. No. 12/778,617 dated Jul. 5, 2013.

International Search Report issued in International Application No. PCT/JP2014/002160 dated Jul. 22, 2014, with English translation.

* cited by examiner

METHOD OF MANUFACTURING EL DISPLAY DEVICE

RELATED APPLICATIONS

This application is a continuation of the U.S. National Phase under 35 U.S.C. §371 of International Application No. PCT/JP2014/002160, filed on Apr. 16, 2014, which in turn claims the benefit of Japanese Application No. 2013-089025, filed on Apr. 22, 2013, the disclosures of which are incorporated by reference herein.

BACKGROUND

1. Field

The present invention relates to methods of manufacturing EL display devices.

2. Description of the Related Art

In recent years, next-generation display devices have been actively developed. Among others, an EL (Electroluminescence) display device receives much attention which has a driving substrate on which first electrodes, a plurality of organic layers including light emitting layers, and second electrodes are laminated in this order. The EL display device features a wide viewing angle because of being self-luminous, power saving expectable due to no need for a backlight, high responsiveness, a thin depth of the device, and the like. For this reason, introduction of the EL display device has been strongly desired into applications for large screen display devices such as television receivers.

In applications of color display, a display technology using three-color pixels, i.e. red, blue, and green colors, is most commonly employed. Besides it, aiming at improving power saving, reliability, etc., developments of other display technologies have been advanced at various manufactures, by using four-color pixels, i.e. red, blue, green, and white colors, or alternatively red, blue, green, and light-blue colors or the like.

In an organic EL light-emitting element, it is required to form, for every pixel, an organic EL light-emitting part for each of three colors of red, blue, and green, or alternatively for each of four colors of such as red, blue, green, and white.

The most common process for forming discrete organic EL parts is such that a fine-metal mask having fine holes is used to form the organic EL parts only at locations corresponding to the holes, by vapor deposition through the mask. For example, a red-color fine-metal mask is used to form the organic EL parts to emit red light by vapor deposition through it a green-color fine-metal mask is used to form the organic EL parts to emit green light by vapor deposition through it; a blue-color fine-metal mask is used to form the organic EL parts to emit blue light by vapor deposition through it. This completes the light emitting parts to emit respective red, green, and blue light.

On the other hand, it is important to develop technology of organic EL light-emitting element which allows the use of a large size substrate, aiming at manufacturing large-size organic EL light-emitting elements and at reducing costs.

Recently, much attention has been paid to the following two methods of forming organic EL light-emitting elements through the use of a large size substrate.

One is such that white-color organic EL elements are formed over the entire region of display, and color display is performed by using a four-color filter for red, green, blue, and white colors. This method is effective in forming a large screen, a high definition display, and the like.

The other, an attention-getting method of forming organic EL light-emitting elements on a large size substrate, is such that organic EL light-emitting parts are formed by a coating method. As the coating method, various processes have been examined which can be divided broadly into two categories: That is, one includes relief printing, flexographic printing, screen printing, and gravure printing, and the other includes inkjet printing (see, Japanese Patent Unexamined Publication No. 2011-249089).

SUMMARY

The present technology disclosed herein is intended to provide a method of manufacturing an EL display device having a light emitting part, in which a plurality of pixels are arrayed, and a thin-film transistor array device to control light emission of the light emitting part. The method includes a luminance measurement step in which luminance data of pixel is obtained, with the light emitting part being lit. The luminance measurement step includes a first luminance measurement step and a second luminance measurement step. In the first luminance measurement step, luminance data of each one of all the pixels is obtained by using a first imaging apparatus having a resolution corresponding to a resolution of the pixels of the light emitting part, with all the pixels being lit. In the second luminance measurement step after the first step, luminance data of an "x×y" pixel-region consisting of an "x" by "y" matrix of pixels is obtained by using a second imaging apparatus having a resolution lower than that of the first imaging apparatus, with the plurality of the pixels being lit in a group-lighting manner that an "X" by "Y" matrix of pixels among the plurality of the pixels is treated as one group and the groups are sequentially lit. Integers "x" and "y" are respectively smaller than integers "X" and "Y". The luminance data of the each pixel obtained in the first luminance measurement step is corrected, based on the obtained luminance data of the "x×y" pixel-region.

DETAILED DESCRIPTION

Hereinafter, descriptions will be made regarding a method of manufacturing an EL display device according to an embodiment of the present technology, with reference to FIGS. 1 to 8 of the accompanying drawings. It is noted, however, that descriptions in more detail than necessary will sometimes be omitted. For example, detailed descriptions of well-known items and duplicate descriptions of substantially the same configuration will sometimes be omitted, for the sake of brevity of the following descriptions and easy understanding by those skilled in the art.

Note that the accompanying drawings and the following descriptions are provided herein to facilitate fully understanding of the present disclosure by those skilled in the art, and are in no way intended to impose any limitation on the subject matter set forth in the appended claims.

Figure 1:
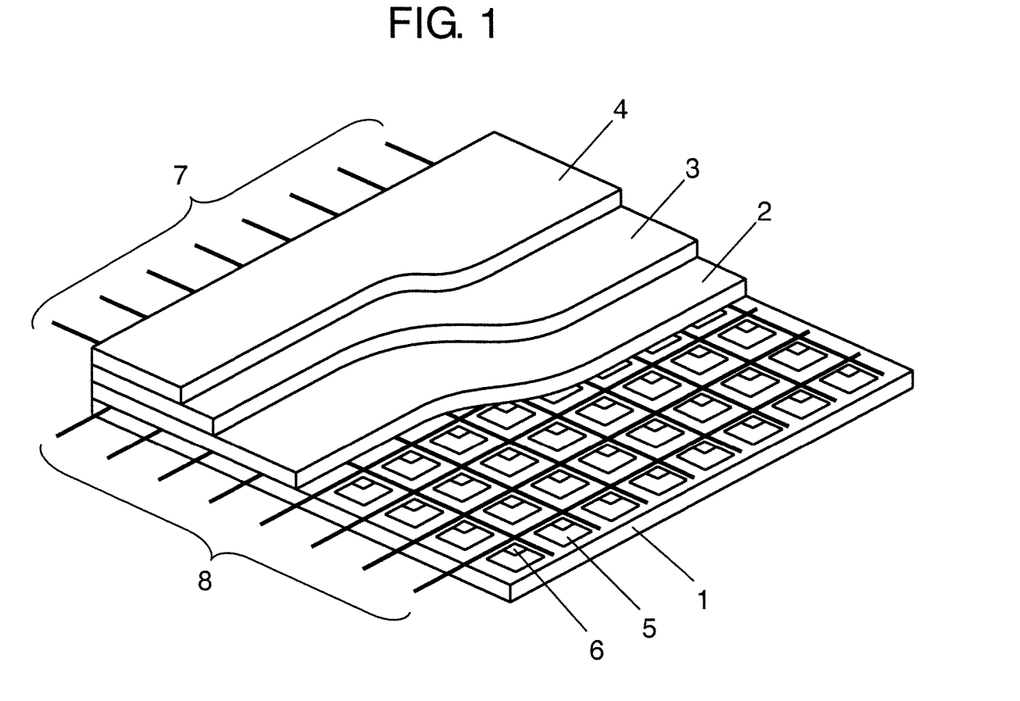
FIG. 1 is a perspective view of an organic EL display device according to the present technology disclosed herein.
Figure 2:
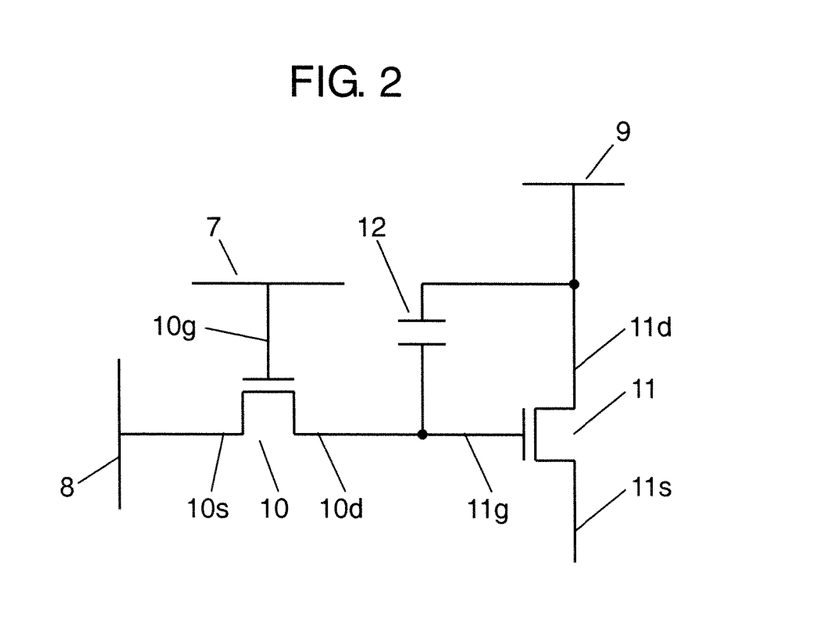
FIG. 2 is an electric circuit diagram of a circuit configuration of a pixel circuit that drives a pixel.

FIG. 1 is a schematic perspective view of a configuration of an EL display device according to the embodiment of the present invention. FIG. 2 is a view of a circuit configuration of a pixel circuit that drives a pixel.

As shown in FIGS. 1 and 2, the organic EL display device is configured having a laminated structure in which thin-film transistor array device 1 and light emitting part are laminated in this order from the lower layer. Thin-film transistor array device 1 includes a plurality of thin-film transistors. The light emitting part includes anode 2 serving as a lower electrode, light emitting layer 3 composed of an organic material, and cathode 4 serving as a transparent upper electrode. Light emission of the light emitting part is controlled by thin-film transistor array device 1. Moreover, the light emitting part has a configuration in which light emitting layer 3 is disposed between anode 2 and cathode 4 serving as a pair of electrodes. Between anode 2 and light emitting layer 3, a hole transport layer is formed by lamination. Between light emitting layer 3 and transparent cathode 4, an electron transport layer is formed by lamination. In thin-film transistor array device 1, a plurality of pixels 5 are disposed in a matrix.

Each of pixels 5 is driven by pixel circuit 6 that is disposed for the each. Moreover, thin-film transistor array device 1 includes a plurality of gate wirings 7 disposed in rows, a plurality of source wirings 8 serving as signal wirings disposed in columns to intersect with gate wirings 7, and a plurality of power supply wirings 9 (omitted in FIG. 1) extending in parallel with source wirings 8.

Gate wirings 7 connect, for every row, with gate electrodes 10g of thin-film transistors 10 which each operate as a switching element included in each of pixel circuits 6. Source wirings 8 connect, for every column, with source electrodes 10s of thin-film transistors 10 which each operate as a switching element included in each of pixel circuits 6. Power supply wirings 9 connect, for every column, with drain electrodes 11d of thin-film transistors 11 which each operate as a driving element included in each of pixel circuits 6.

As shown in FIG. 2, each of pixel circuits 6 is configured with thin-film transistor 10 operating as the switching element, thin-film transistor 11 operating as the driving element, and capacitor 12 storing data to be displayed at the corresponding pixels.

Thin-film transistor 10 is configured with gate electrode 10g connected to gate wiring 7, source electrode 10s connected to source wiring 8, drain electrode 10d connected to both capacitor 12 and gate electrode 11g of thin-film transistor 11, and a semiconductor film (not shown). Upon applying voltages to gate wiring 7 and source wiring 8 both connected to thin-film transistor 10, the transistor 10 stores, in capacitor 12, the value of the voltage applied to source wiring 8, with the value being as display data.

Thin-film transistor 11 is configured with gate electrode 11g connected to drain electrode 10d of thin-film transistor 10, drain electrode 11d connected to both power supply wiring 9 and capacitor 12, source electrode 1 is connected to anode 2, and a semiconductor film (not shown). Thin-film transistor 11 supplies current corresponding to the voltage value stored in capacitor 12, to anode 2 from power supply wiring 9 via source electrode 11s. That is, the EL display device with the configuration described above employs an active matrix system in which display control is performed for every pixel 5 that is located at an intersection of gate wiring 7 and source wiring 8.

Moreover, in the EL display device, the light emitting parts that emit light of at least red, green, and blue lights are such that a plurality of sub-pixels is disposed in a matrix to form the plurality of the pixels. The sub-pixels have the respective light emitting layers to emit respective light of at least red light (R), green light (G), and blue light (B). The sub-pixels constituting each pixel are separated from each other by banks. The banks are formed in such a manner that protruded ribs extending in parallel with gate wirings 7 and protruded ribs extending in parallel with source wiring 8 are formed to intersect with each other. Then, in portions surrounded by the respective protruded ribs, i.e. in openings of the banks, the sub-pixels having the respective light emitting layers of R, G, and B are formed.

Figure 3:
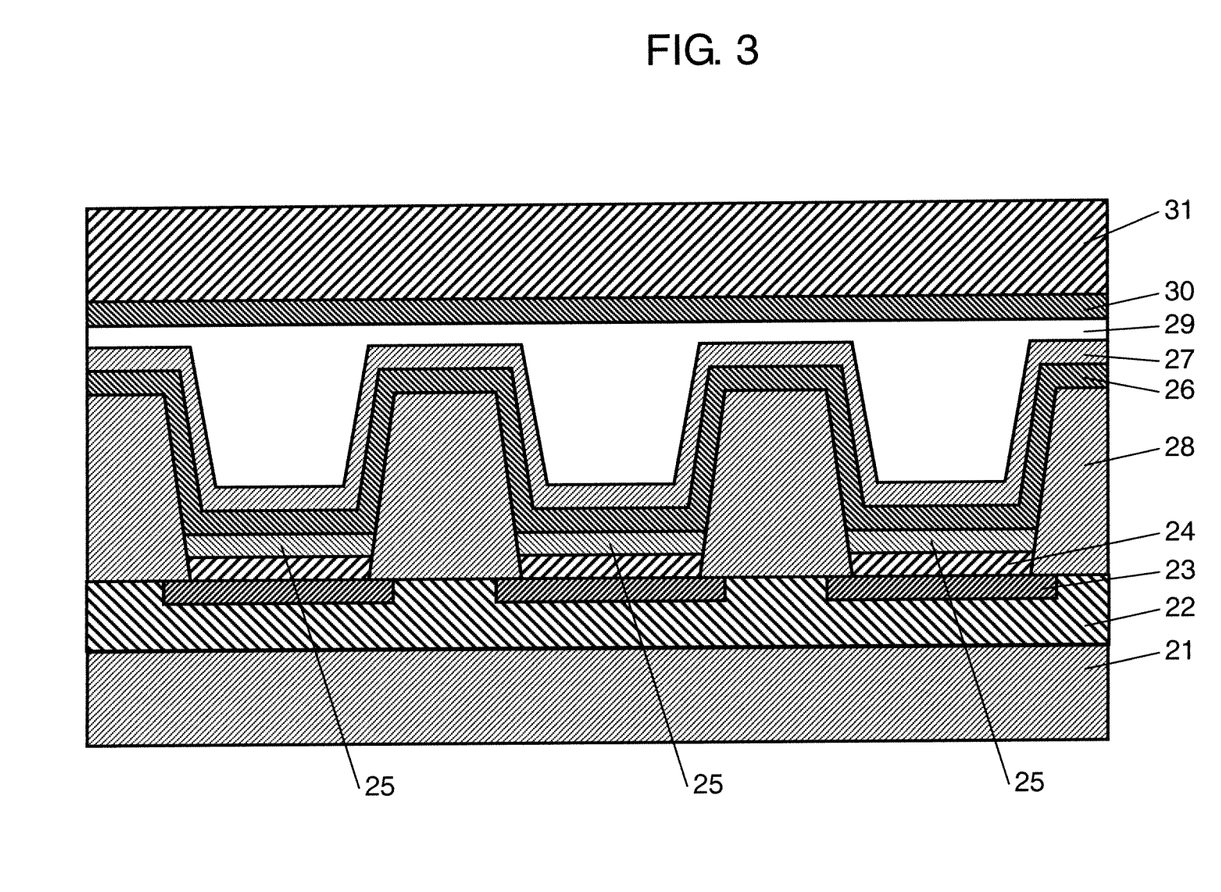
FIG. 3 is a cross-sectional view of a cross-sectional structure of sub-pixel portions of R, G, and B, in the EL display device.

FIG. 3 is a cross-sectional view of a cross-sectional structure of the sub-pixel portions of R, G, and B, in the EL display device. As shown in FIG. 3, the panel part of the EL display device is such that, on base substrate 21 such as a glass substrate or a flexible resin substrate, thin-film transistor array device 22 is formed which constitutes pixel circuits 6 described above. In addition, on thin-film transistor array device 22, anodes 23 serving as the lower electrodes are formed via a planarization insulating film (not shown). Then, on top of the anodes 23, there are laminated hole transport layer 24, light emitting layer 25 composed of the respective organic material to emit light of R, G, or B, electron transport layer 26, and cathode 27 serving as the transparent upper electrode, in this order. This constitutes the organic EL light-emitting parts of R, G, and B.

Moreover, each of light emitting layers 25 of the light emitting parts is formed in a region partitioned by banks 28 that are insulating layers. Banks 28 are intended to partition the light emitting region into predetermined shapes as well as to ensure the insulation between anodes 23 and cathodes 27. The banks are composed of a photosensitive resin including silicon oxide and polyimide, for example.

Note that, in the embodiment described above, only hole transport layers 24 and electron transport layers 26 are shown; however, in each of transport layers 24 and electron transport layers 26, a hole injection layer and an electron injection layer are formed by lamination, respectively.

The thus-configured light emitting parts are covered with sealing layer 29 made of such as silicon nitride. In addition, on top of sealing layer 29, sealing substrate 31 such as a transparent glass substrate or a transparent flexible resin substrate is bonded via bonding layer 30 over the entire sealing layer to seal the light emitting parts.

Here, for base substrate 21, its material may be appropriately selected depending on the application purpose, without particular restrictions in terms of shape, material, and size. For example, it may be a glass substrate such as a non-alkali glass or soda glass substrate, a silicon substrate, or a metal substrate. Moreover, being targeted at light weight and/or flexible performance, a polymeric material may be used for the substrate. For the polymeric material, there are suited polyethylene terephthalate, polycarbonate, polyethylene naphthalate, polyamide, polyimide, and the like.

Other known polymeric materials for the substrate may be used including an acetate resin, an acryl resin, polyethylen, polypropylene, a polyvinylchloride resin, and the like. When the polymeric material is used for the substrate, the method of manufacturing the device is such that the polymeric material is formed by coating or bonding on a stiff substrate such as a glass one, followed by forming the organic EL light-emitting elements on the polymeric material. After that, the stiff substrate such as the glass one is removed.

Anodes 23 are configured using, such as, a metal material with high conductivity including aluminum, an aluminum alloy, and copper, or alternatively using a metal oxide or a metal sulfide which is optically transparent and highly electric-conductive, including IZO, ITO, tin oxide, indium oxide, and zinc oxide. The formation of the anodes may employ a method of forming thin films including vacuum vapor deposition, sputtering, and ion plating.

Hole transport layers 24 are configured using, such as, a polyvinyl carbazole material, a polysilane material, a polysiloxane derivative, a phthalocyanine compound including copper phthalocyanine, or an aromatic amine compound. The formation of the hole transport layers can employ various kinds of coating method. The hole transport layers are formed with a thickness of about 10 nm to 200 nm. Moreover, the hole injection layer laminated on hole transport layers 24 is one that enhances injection of holes from anode 23. The hole injection layer is formed by sputtering with a metal oxide such as molybdenum oxide, vanadium oxide, or aluminum oxide, or alternatively with a metal nitride or a metal oxynitride.

Light emitting layers 25 is configured mainly with an organic material which shows fluorescence and/or phosphorescence. When required, a dopant is added to the light emitting layers to improve characteristics of the layers. As a polymeric organic material suitable for printing, there are used a polyvinyl carbazole derivative, a poly-para-phenylene derivative, a polyfluorene derivative, a polyphenylene vinylene derivative, or the like. The dopant is used to shift wavelengths of emitted light and/or to improve light-emission efficiency. A wide range of the dopants, dye-based and metal complex-based ones, have been developed. Moreover, when light emitting layers 25 are formed on a large size substrate, printing methods are suitable for the formation thereof. Among various printing methods, an inkjet method is favorably used to form light emitting layers 25 with a thickness of about 20 nm to 200 nm.

Electron transport layers 26 are configured with a material including a benzoquinone derivative, a polyquinoline derivative, an oxadiazole derivative. The electron transport layers are formed through film formation by, such as, vacuum vapor deposition or coating application, to have a thickness of commonly about 10 nm to 200 nm. Moreover, the electron injection layers are formed, by vacuum vapor deposition or coating application, with a material including barium, phthalocyanine, and lithium fluoride.

Cathodes 27 are formed with a different material depending on the type of output direction of emitted light. For the type in which the emitted light is output from the cathode 27 side, the material is an optically-transparent and conductive material such as ITO, IZO, tin oxide, or zinc oxide. For the type in which the emitted light is output from the anode 23 side, the material is platinum, gold, silver, copper, tungsten, aluminum, an aluminum alloy, or the like. The cathodes are formed through film formation by, such as, sputtering or vacuum vapor deposition, to have a thickness of about 50 nm to 500 nm.

Banks 28 have a structure needed for filling each region with a sufficient amount of a solution containing the material of light emitting layers 25, and are formed in a predetermined shapes by photolithography. By controlling the shapes of banks 28, it is possible to define the shapes of the sub-pixels of the organic EL light-emitting part.

Sealing layer 29 is formed by forming a film of silicon nitride, and its film formation can employ a CVD (Chemical Vapor Deposition) method.

Such the EL display device has variations in characteristics of the thin-film transistor array device and the light emitting part, with the variations being caused in their manufacturing steps. The variations produce different luminance of the light-emission of each of the pixels, even when the same driving signal is supplied to the pixels, resulting in nonuniformity in luminance. To address this problem, the EL display device employs a driving method in which the luminance of each pixel is measured and, based on the measured data, correction data are determined in advance which are to be used for correction of the driving signal supplied to the each pixel. Then, using the correction data, the current supplied to the each pixel is corrected when the EL display device emits light.

Next, the step of measuring the luminance for determining the correction data will be described, in the manufacturing method according to the present technology disclosed herein.

Figure 4:
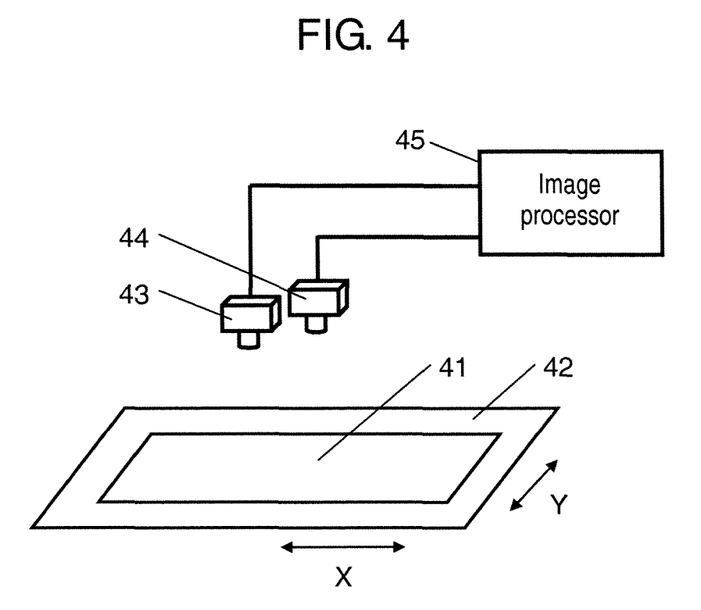
FIG. 4 is a perspective view illustrating a step of measuring luminance of each of the pixels, with a light emitting part of the EL display device emitting light, in a method of manufacturing the EL display device according to an embodiment of the present technology.
Figure 5:
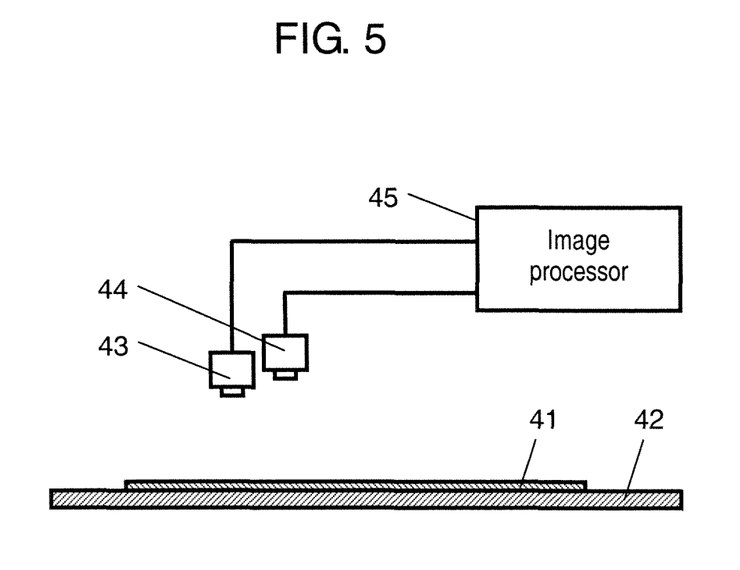
FIG. 5 is a side-elevational view when viewed from a lateral direction in FIG. 4.

FIG. 4 is a perspective view illustrating the step of measuring the luminance of the each pixel, with the light emitting part emitting light, in the method of manufacturing the organic EL display device according to the embodiment of the present technology. FIG. 5 is a side-elevational view when viewed from a lateral direction in FIG. 4.

As shown in FIGS. 4 and 5, after EL display device 41 described using FIG. 3 has been manufactured, the device is mounted on stage 42 movable in the X and Y directions. After that, each of the sub-pixels of R, G, and B is supplied with the driving signal to light it, and the light-emission of the each pixel is measured with first imaging apparatus 43 using a CCD camera.

First imaging apparatus 43 has the same resolution as that of the EL display device such that the resolution of the apparatus corresponds to the resolution of the pixels of the light emitting part.

Next, after first imaging apparatus 43 has completed the measurement of the light-emission of each of the pixels, EL display device 41 is moved to a position where second imaging apparatus 44 can measure the EL display device, with the second imaging apparatus using a CCD camera which is lower in resolution than the CCD camera of first imaging apparatus 43. Then, second imaging apparatus 44 measures the light-emission of a plurality of the pixels.

The thus-measured image data obtained by using both first imaging apparatus 43 and second imaging apparatus 44 are each transmitted to image processor 45. Image processor 45 obtains luminance data, based on the image data measured with both first imaging apparatus 43 and second imaging apparatus 44, to determine the correction data for the each pixel.

Figure 6:
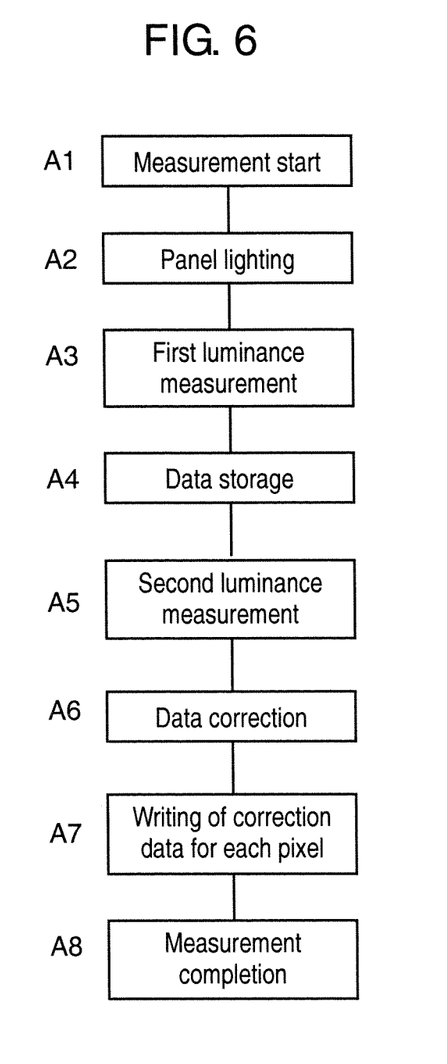
FIG. 6 is a flowchart illustrating an example of a luminance measurement step which includes steps for determining the correction data for the each pixel, in the EL display device according to the present technology.
Figure 7:
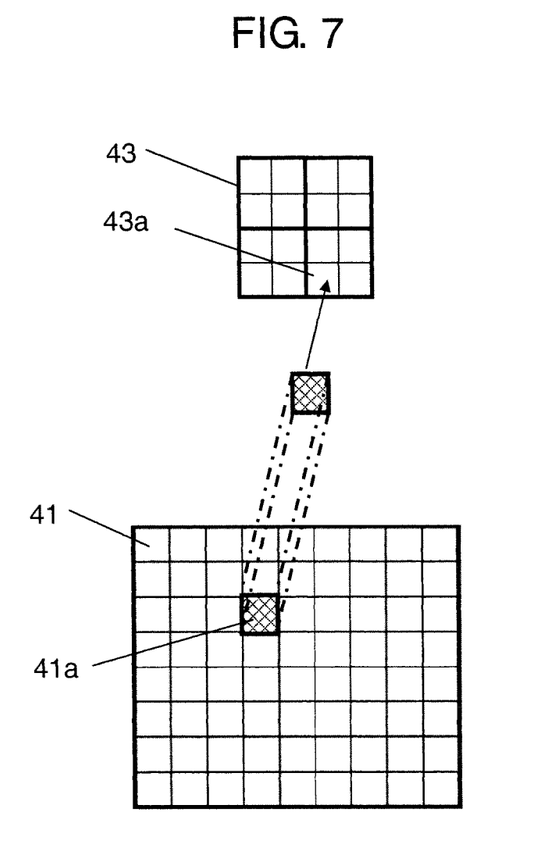
FIG. 7 is an illustrative view of a first luminance measurement step, i.e. a step of measuring light emission of the each pixel by using a first imaging apparatus.
Figure 8:
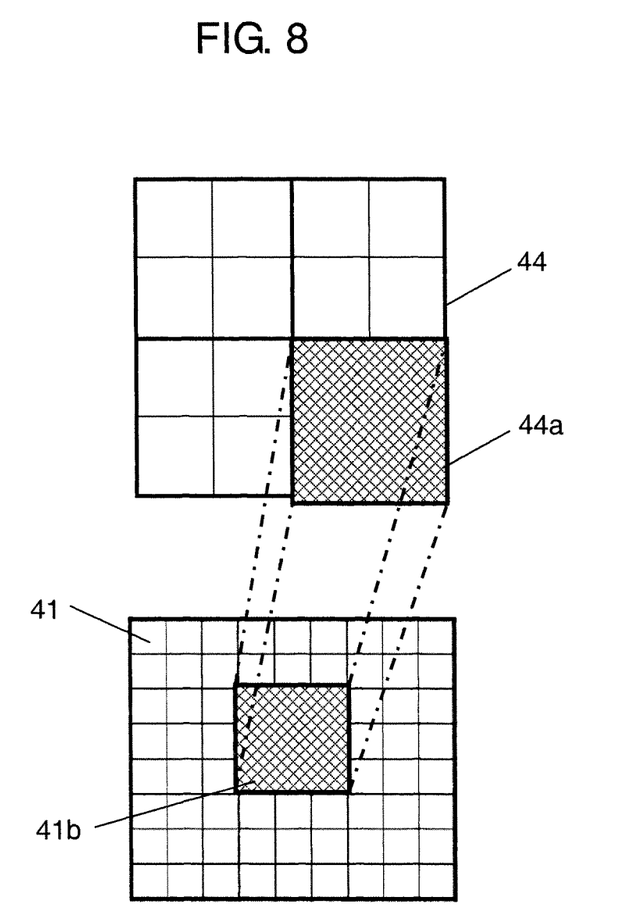
FIG. 8 is an illustrative view of a second luminance measurement step, i.e. a step of measuring light emission of a plurality of the pixels by using a second imaging apparatus.

FIG. 6 is a flowchart illustrating an example of a luminance measurement step which includes steps for determining the correction data for the each pixel, in the EL display device according to the present technology. FIG. 7 is an illustrative view of a first luminance measurement step, i.e. the step of measuring the light emission of the each pixel by using the first imaging apparatus. FIG. 8 is an illustrative view of a second luminance measurement step, i.e. the step of measuring the light emission of the plurality of the pixels by using the second imaging apparatus.

As shown in FIG. 6, the luminance measurement step of measuring the luminance of the each pixel, with the light emitting part emitting light, is performed as follows. First, in measurement starting step A1, as shown in FIGS. 4 and 5, the EL display device is mounted on stage 42 movable in the X and Y directions.

Next, in panel lighting step A2, each of the sub-pixels of R, G, and B is lit by supplying the driving signal to it.

Next, in first luminance measurement step A3, the light emission of the each pixel is measured, with the stage 42 being moved, by using first imaging apparatus 43 that has the CCD camera with the resolution corresponding to that of the pixels of the light emitting part. In first luminance measurement step A3, as shown in FIG. 7, the light emission of the each pixel is measured over the entire panel in such a manner that: Pixel 41a of EL display device 41 is sequentially lit, and the thus-lit pixel is measured with first imaging apparatus 43, with the position of the imaging apparatus being aligned to render the imaging apparatus capable of taking the image of lit pixel 41a. At this moment, first imaging apparatus 43 performs the measurement by using imaging element 43a that has a resolution corresponding to that of pixel 41a. FIG. 7 shows an example where first imaging apparatus 43 has a 4×4 matrix of imaging elements, i.e. 16 elements.

Based on the image obtained in first luminance measurement step A3, image processor 45 performs image processing to obtain the luminance data of each of all the pixels. Then, the image processor performs data storage step A4 in which the luminance data are temporally stored in a memory medium such as readable and writable RAM.

Next, in second luminance measurement step A5, second imaging apparatus 44 measures the light emission of the plurality of the pixels, with the second imaging apparatus using the CCD camera that is lower in resolution than the CCD camera of first imaging apparatus 43. In second luminance measurement step A5, as shown in FIG. 8, a pixel-region consisting of "X" pixels in the longitudinal direction by "Y" pixels in the lateral direction of EL display device 41 is treated as one group of pixels. For example, pixel-region 41b consisting of an "X" by "Y" matrix of pixels=3×3 pixels=9 pixels is treated as one group. These groups are sequentially lit. Then, the light emission of pixel-region 41b consisting of the plurality of the pixels is measured, with the position of second imaging apparatus 44 being aligned to render the second imaging apparatus capable of taking the image of thus-lit pixel-region 41b. In this step, second imaging apparatus 44 measures the lit pixel-region consisting of 3×3 pixels=9 pixels, by using imaging elements 44a arranged in an "x" (an integer smaller than "X") by "y" (an integer smaller than "Y") matrix, that is, for example, "x"×"y"=2×2=4 imaging elements 44a. FIG. 8 shows an example where second imaging apparatus 44 has 4×4=16 imaging elements.

Then, image processor 45 performs data correction step A6 in such a manner that: Based on the image obtained in second luminance measurement step A5, the image processor performs image processing of the image to obtain luminance data of the measured region. The resulting luminance data, together with the data obtained in first luminance measurement step A3, are then subjected to arithmetic processing to correct the data obtained in first luminance measurement step A3. Moreover, after the data correction step has been completed, image processor 45 performs correction data writing step A7 in which the correction data for each pixel are restored in the memory medium. This leads to measurement completion A8.

In this way, the luminance measurement step includes first luminance measurement step A3 and second luminance measurement step A5. In first luminance measurement step A3, first imaging apparatus 43 obtains the luminance data by measuring the light emission of the each pixel, with first imaging apparatus 43 having the resolution corresponding to the resolution of the pixels of the light emitting part. In second luminance measurement step A5 after first luminance measurement step A3, second imaging apparatus 44 measures the light emission of the plurality of the pixels to correct the luminance data, with second imaging apparatus 44 having the resolution lower than that of first imaging apparatus 43. With this configuration, the correction dater for each pixel, which are used in driving the EL display device, are determined in such a manner that: The correction data are obtained by acquiring the image data of the each pixel when the pixels are individually lit, and then the thus-obtained correction data are subjected to the correction based on the image data obtained when the plurality of the pixel-regions is sequentially lit. Use of the thus-corrected correction allows the EL display device to provide more uniform luminance of light-emission over the entire display screen, leading to improved yields in manufacturing the EL display devices.

Note that, in the embodiments described above, although the descriptions have been made using the top-emission type device which has the structure easy to realize higher definition, the present technology disclosed herein is also effective for a bottom-emission type structure.

As described above, the aforementioned embodiments have been described for exemplifying the technology according to the present disclosure. However, the present technology disclosed herein is not limited to the embodiments, and may be applied to other embodiments which have been subjected to changes and modifications, replacements, additions, omissions, or the like.

As described above, the technology according to the present invention is effective for increasing yields in manufacturing the EL display devices.

What is claimed is:

1. A method of manufacturing an EL display device having a light emitting part, in which a plurality of pixels are arrayed, and a thin-film transistor array device to control light emission of the light emitting part, the method comprising a luminance measurement step of obtaining luminance data of pixel with the light emitting part being lit, the luminance measurement step including:
a first luminance measurement step; and
a second luminance measurement step after the first step,
wherein the first luminance measurement step is to obtain luminance data of each one of all the pixels by measuring light emission of the each pixel with all the pixels being lit, by using a first imaging apparatus having a resolution corresponding to a resolution of the pixels of the light emitting part;
the second luminance measurement step is to obtain luminance data of an "X×Y" pixel-region by measuring light emission of pixels in the "X×Y" pixel-region with the plurality of the pixels being lit in a group-lighting manner, the "X×Y" pixel-region being obtained by using "x"×"y" imaging elements included in a second imaging apparatus having a resolution lower than the resolution of the first imaging apparatus, the "X×Y" pixel-region consisting of an "X" by "Y" matrix of pixels among the plurality of the pixels, the group-lighting manner being such that an "X" by "Y" matrix of pixels among the plurality of the pixels is treated as one group and the groups are sequentially lit, integers "x" and "y" being respectively smaller than integers "X" and "Y"; and wherein the luminance data of the each pixel obtained in the first luminance measurement step is corrected, based on the obtained luminance data of the "X×Y" pixel-region.

* * * * *